(12) United States Patent
Lee et al.

(10) Patent No.: US 7,671,419 B2
(45) Date of Patent: Mar. 2, 2010

(54) TRANSISTOR HAVING COUPLING-PREVENTING ELECTRODE LAYER, FABRICATING METHOD THEREOF, AND IMAGE SENSOR HAVING THE SAME

(75) Inventors: Kang-Bok Lee, Gyeonggi-do (KR); Jong-Cheol Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 11/962,401

(22) Filed: Dec. 21, 2007

(65) Prior Publication Data
US 2008/0191250 A1    Aug. 14, 2008

(30) Foreign Application Priority Data
Feb. 13, 2007    (KR) ...................... 10-2007-0015092

(51) Int. Cl.
*H01L 29/78* (2006.01)
(52) U.S. Cl. ................ 257/366; 257/365; 257/E29.134
(58) Field of Classification Search ................ 257/365, 257/366, E29.134
See application file for complete search history.

(56) References Cited

U.S. PATENT DOCUMENTS

| | | | | |
|---|---|---|---|---|
| 5,047,816 A | * | 9/1991 | Cuevas | 257/366 |
| 5,162,879 A | * | 11/1992 | Gill | 257/391 |
| 6,753,579 B2 | * | 6/2004 | Baba | 257/365 |
| 6,965,145 B2 | * | 11/2005 | Choi | 257/326 |

FOREIGN PATENT DOCUMENTS

| | | | |
|---|---|---|---|
| JP | 59107564 A | * | 6/1984 |
| JP | 11-135764 A | | 5/1999 |
| JP | 2005-093554 A | | 4/2005 |
| JP | 2005-197681 A | | 7/2005 |

* cited by examiner

*Primary Examiner*—Allan R. Wilson
(74) *Attorney, Agent, or Firm*—Myers Bigel Sibley & Sajovec

(57) ABSTRACT

A transistor having an electrode layer that can reduce or prevent a coupling effect, a fabricating method thereof, and an image sensor having the same are provided. The transistor includes a semiconductor substrate and a well of a first conductivity type formed on the semiconductor substrate. A heavily-doped first impurity region of a first conductivity type surrounds an active region defined in the well. Heavily-doped second and third impurity regions of a second conductivity type are spaced apart from each other in the active region an define a channel region interposed therebetween. A gate is formed over the channel region to cross the active region. The gate overlaps at least a portion of the first impurity region and receives a first voltage. An electrode layer is formed between the semiconductor substrate and the gate, such that the electrode layer overlaps a portion of the first impurity region contacting the channel region and receives a second voltage. An insulation layer is formed between the semiconductor substrate and the electrode layer, the semiconductor substrate and the gate, and the electrode layer and the gate. The insulation layer surrounds the electrode layer.

13 Claims, 7 Drawing Sheets

TRANSISTOR HAVING COUPLING-PREVENTING ELECTRODE LAYER, FABRICATING METHOD THEREOF, AND IMAGE SENSOR HAVING THE SAME

CROSS-REFERENCE TO RELATED PATENT APPLICATION

This U.S. non-provisional patent application claims priority under 35 U.S.C. §119 of Korean Patent Application No. 10-2007-0015092, filed on Feb. 13, 2007, in the Korean Intellectual Property Office, the entire contents of which are hereby incorporated by reference.

BACKGROUND OF THE INVENTION

The present invention relates to semiconductor devices, and more particularly, to image sensors and transistors.

Image sensors are semiconductor devices that may convert an optical image into an electric signal. With recent developments of computer and communication industries, image sensors have become widely used in various fields, including, for example, digital cameras, camcorders, personal computer systems (PCSs), game devices, surveillance cameras, medical micro cameras, and robots, among others.

Image sensors can be classified into a number of types, including, for example, charge coupled device (CCD) image sensors and CMOS image sensors. CMOS image sensors may be easy to drive and may be fabricated using a conventional CMOS fabrication technology. In this regard, a manufacturing cost of CMOS image sensors may be low. CMOS image sensors may be implemented to include various structures. For example, some CMOS image sensors may be fabricated using four transistors, while some CMOS image sensors may be fabricated using three transistors. A transistor structure for pixels of CMOS image sensors may be fabricated using a CMOS fabrication process.

In a conventional method of fabricating a MOS transistor for a unit pixel of a CMOS image sensor, an active region may be defined by forming an isolation layer in a semiconductor substrate using an isolation process. For example, a shallow trench isolation (STI) process or a local oxidation of silicon (LOCOS) process may be used. When the active region is defined by the isolation layer, electrons may be trapped because a dangling bonding of silicon is broken at an interface between a silicon substrate and an oxide layer as the isolation layer. The unwanted trapping of electrons may lead to the occurrence of noise, which may degrade the characteristics of the image sensor.

SUMMARY OF THE INVENTION

Embodiments of the present invention are directed to a transistor having an electrode layer, which may reduce noise and a coupling effect, a fabricating method thereof, and an image sensor having the same. In some embodiments, a transistor may include a semiconductor substrate, a well of a first conductivity type formed on the semiconductor substrate and a heavily-doped first impurity region of the first conductivity type surrounding an active region defined in the well. Embodiments of the transistor may further include heavily-doped second and third impurity regions of a second conductivity type spaced apart from each other in the active region, the heavily-doped second and third regions configured to define a channel region interposed therebetween and a gate formed over the channel region to cross the active region, the gate configured to overlap at least a portion of the first impurity region and receive a first voltage. Embodiments of the transistor may include an electrode layer formed between the semiconductor substrate and the gate, the electrode layer configured to overlap a portion of the first impurity region contacting the channel region and receive a second voltage and an insulation layer formed between the semiconductor substrate and the electrode layer, the semiconductor substrate and the gate, and the electrode layer and the gate, the insulation layer configured to surround the electrode layer.

In some embodiments, the second voltage includes a constant magnitude. In some embodiments, the second voltage is zero volts. In some embodiments, the second voltage is a voltage in the range from zero volts to a voltage having a magnitude equal to that of the first voltage and a polarity opposite to that of the first voltage.

In some embodiments, the insulation layer includes an oxide layer formed by an oxidation process. Some embodiments include an epitaxial layer formed on the substrate, wherein the well is formed within the epitaxial layer. Some embodiments include an ion implant layer formed in the channel region configured to adjust a threshold voltage of the transistor. Some embodiments include a capping layer formed on the gate to surround the gate. In some embodiments, the capping layer includes an oxide layer formed by an oxidation process.

Some embodiments of the present invention include an image sensor. Embodiments of such an image sensor may include a photoelectric conversion unit that is configured to convert incident light into an electric signal, a charge transfer unit that is configured to transfer charges accumulated in the photoelectric conversion unit and a charge detection unit that is configured to convert the accumulated charges transferred through the charge transfer unit into a voltage signal. Some embodiments include an amplification unit that is configured to amplify the voltage signal from the charge detection unit and a reset unit that is configured to reset the charge detection unit. In some embodiments, the amplification unit includes a metal-oxide-semiconductor (MOS) transistor.

Embodiments of the MOS transistor may include a semiconductor substrate, a well of a first conductivity type formed on the semiconductor substrate, and a heavily-doped first impurity region of the first conductivity type configured to surround an active region defined in the well. Embodiments of the MOS transistor may further include heavily-doped second and third impurity regions of a second conductivity type spaced apart from each other in the active region, the heavily-doped second and third regions configured to define a channel region interposed therebetween and a gate formed over the channel region to cross the active region, the gate configured to overlap at least a portion of the first impurity region and receive a first voltage. Embodiments of the MOS transistor may further include an electrode layer formed between the semiconductor substrate and the gate. The electrode layer may be configured to overlap a portion of the first impurity region contacting the channel region and receive a second voltage. Embodiments of the MOS transistor may include an insulation layer formed between the semiconductor substrate and the electrode layer, the semiconductor substrate and the gate, and the electrode layer and the gate, such that the insulation layer is configured to surround the electrode layer.

In some embodiments, the second voltage includes a constant magnitude. In some embodiments, the second voltage includes zero volts. In some embodiments, the second voltage includes a voltage in a range from zero volts to a voltage having a magnitude equal to that of the first voltage and a polarity opposite to that of the first voltage.

Some embodiments of the present invention include a method of fabricating a transistor. Embodiments of such methods include forming a well of a first conductivity type on a semiconductor substrate, forming a heavily-doped first impurity region of the first conductivity type defining an active region, and forming a first gate insulation layer on the semiconductor substrate. Such methods further include forming an electrode layer on the first gate insulation layer above the first impurity region contacting a channel region of the active region, forming a gate on the first gate insulation layer above the channel region, such that the gate crosses the active region and overlaps at least a portion of the electrode layer, and forming heavily-doped impurity regions of a second conductivity type on either side of the channel region in the active region by using the gate as a mask.

Some embodiments include forming an ion implant layer in the channel region, the ion implant layer configured to adjust a threshold voltage of the MOS transistor prior to forming the electrode layer and after forming the heavily-doped first impurity region.

In some embodiments, forming the well includes forming an epitaxial layer on the substrate and implanting impurity ions of the first conductivity type into the epitaxial layer. In some embodiments, forming the electrode layer includes depositing a first polysilicon layer on the gate insulation layer, forming a first oxide layer on the first polysilicon layer using an oxidation process, patterning the first polysilicon layer and the first oxide layer to form the electrode layer and a first oxide layer pattern, and removing the first oxide layer pattern.

Some embodiments include, after removing the first oxide layer pattern, forming a second gate insulation layer on the electrode layer using an oxidation process. In some embodiments, forming the gate on the first gate insulation layer includes forming a second polysilicon layer on the first gate insulation layer and the second gate insulation layer, forming a second oxide layer on the second polysilicon layer using an oxidation process, patterning the second polysilicon layer and the second oxide layer to form the gate and a second oxide layer pattern, and removing the second oxide layer pattern.

Some embodiments include, after removing the second oxide layer pattern, forming a capping oxide layer on the gate using an oxidation process.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF EMBODIMENTS OF THE INVENTION

Figure 1:
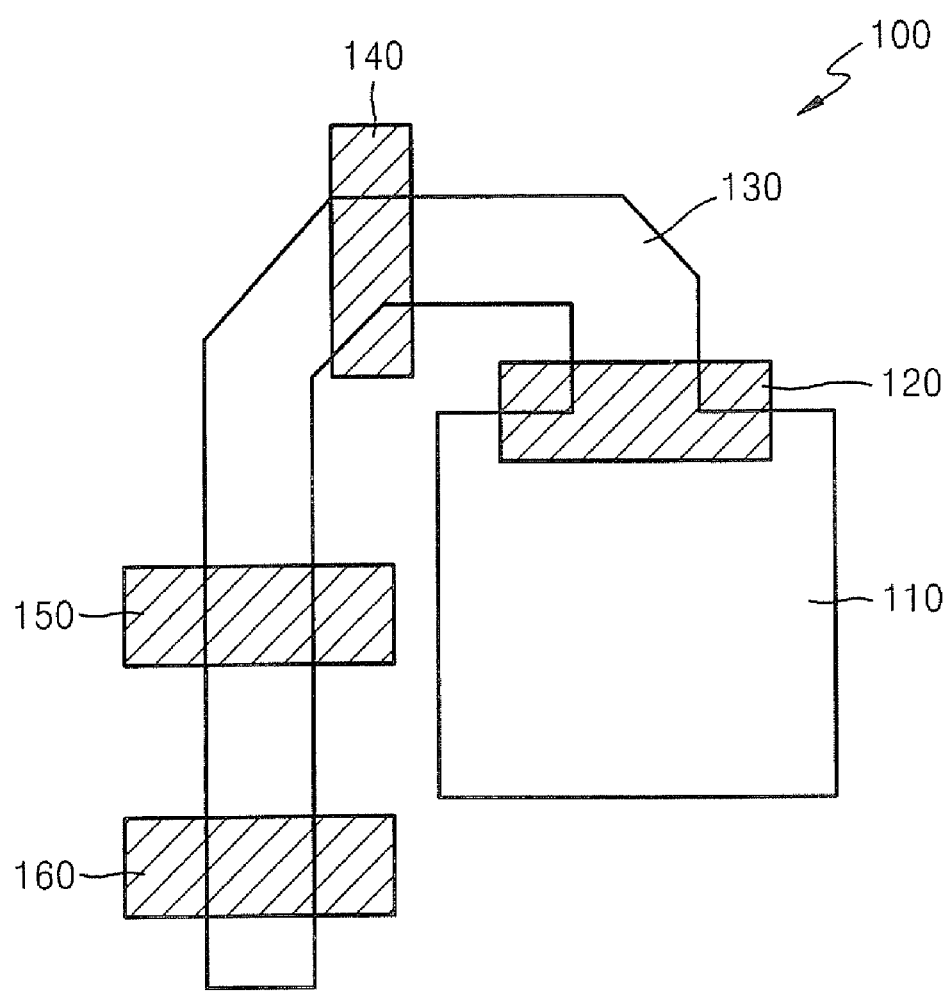
FIG. 1 is a plan view illustrating a unit pixel of an image sensor according to some embodiments of the present invention.

The present invention will now be described more fully with reference to the accompanying drawings, in which embodiments of the invention are shown. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layers) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that termes, such as those defined in commonly used dictionaries, should be interpreted as having a meaning that is consistent with their meaning in the context of the relevant art and will not be interpreted in an idealized or overly formal sense unless expressly so defined herein.

Figure 2:
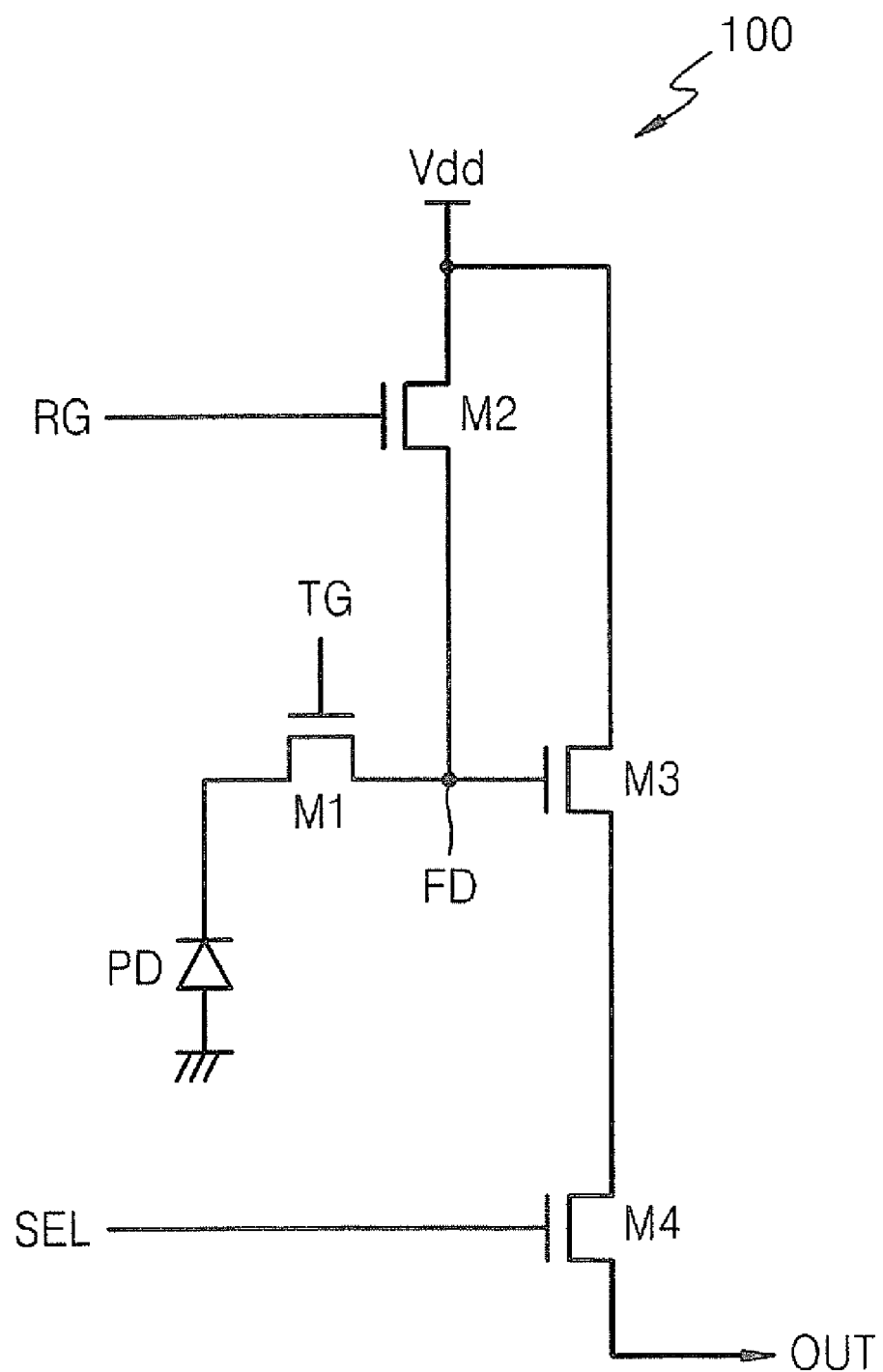
FIG. 2 is an equivalent circuit diagram of the unit pixel of the image sensor illustrated in FIG. 1.

Reference is made to FIGS. 1 and 2, which are a plan view illustrating a unit pixel of an image sensor according to some embodiments of the present invention and an equivalent circuit diagram of the unit pixel of the image sensor illustrated in FIG. 1, respectively. A unit pixel 100 includes a photoelectric conversion unit 110, a charge transfer unit 120, a charge detection unit 130, a reset unit 140, an amplification unit 150, and a selection unit 160. In some embodiments, the photoelectric conversion unit 110 is configured to convert incident light into an electrical signal. Specifically, the photoelectric conversion unit 110 may generate electric charges in accordance with the incident light and accumulate the electric charges therein. Examples of a photoelectric conversion unit 110 include, for example, a photodiode PD, a phototransistor, a photogate, and/or a pinned photodiode (PPD), among others.

The charge detection unit 130 may be configured to convert the charges accumulated in the photoelectric conversion unit 110 into a voltage signal. In some embodiments, the accumulated charges in the photoelectric conversion unit 110 are transferred to the charge detection unit 130 through the charge transfer unit 120. Since the charge detection unit 130 may have a parasitic capacitance, the charges may be cumulatively stored therein. The charge detection unit 130 may include a floating diffusion region FD. The charge detection unit 130 may be connected to the amplification unit 150 and may control the amplification unit 150.

The charge transfer unit 120 may be configured to transfer the charges accumulated in the photoelectric conversion unit 110 to the charge detection unit 130. The charge transfer unit 120 may include an n-channel metal-oxide-semiconductor (NMOS) transistor M1. The NMOS transistor M1 may have a drain connected to the photodiode PD of the photoelectric conversion unit 110, a source connected to the floating diffusion region FD of the charge detection unit 130, and a gate configured to receive a charge transfer driving signal TG. In this manner, the NMOS transistor M1 of the charge transfer unit 120 may be driven in response to the charge transfer driving signal TG.

The reset unit 140 may be configured to periodically reset the charge detection unit 130. The reset unit 140 may include an NMOS transistor M2. The NMOS transistor M2 may have a source connected to the floating diffusion region FD of the charge detection unit 130, a drain connected to a power supply voltage terminal Vdd, and a gate configured to receive a reset signal RG. In this manner, the NMOS transistor M2 may be driven in response to the reset signal RG.

The amplification unit 150 may serve as a source follower buffer amplifier in cooperation with an external constant current source (not shown). The amplification unit 150 may include an NMOS transistor M3. The NMOS transistor M3 may have a drain connected to the power supply voltage terminal Vdd, a source connected to an NMOS transistor M4 of the selection unit 160, and a gate connected to the floating diffusion region FD of the charge detection unit 130. In this manner, the amplification unit 150 may amplify the voltage signal of the charge detection unit 130.

The selection unit 160 may select unit pixels to be read in units of rows among a plurality of unit pixels 100 arranged in a pixel array (not shown). The selection unit 160 may include the NMOS transistor M4. The NMOS transistor M4 may have a source connected to an output line OUT, a drain connected to the source of the NMOS transistor M3 of the amplification unit 150, and a gate configured to receive a pixel select signal SEL. In this manner, the NMOS transistor M4 of the selection unit 160 may be driven in response to the pixel select signal SEL.

Figure 3:
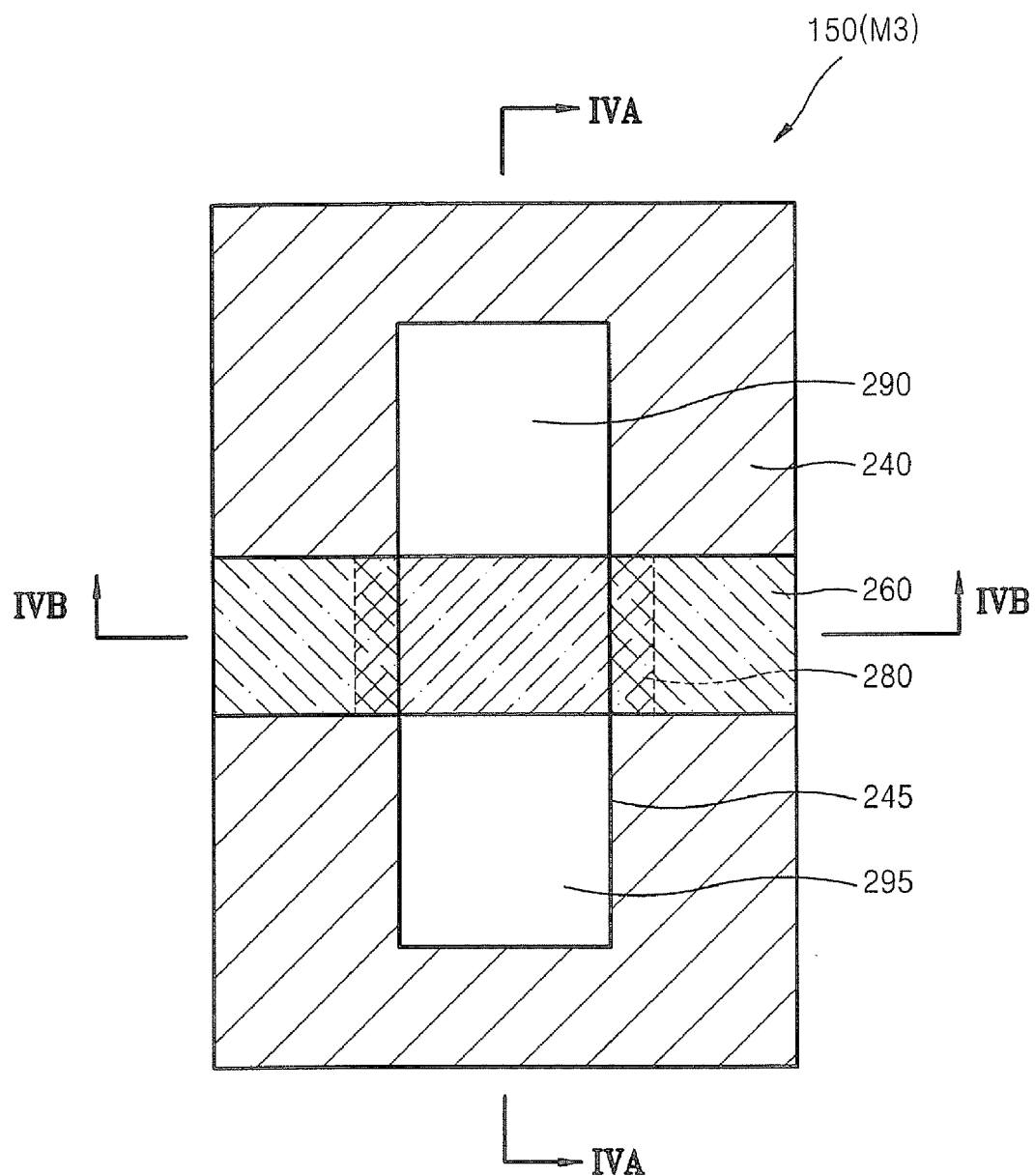
FIG. 3 is a plan view of a MOS transistor of an amplification unit of the image sensor illustrated in FIG. 2.
Figure 4A:
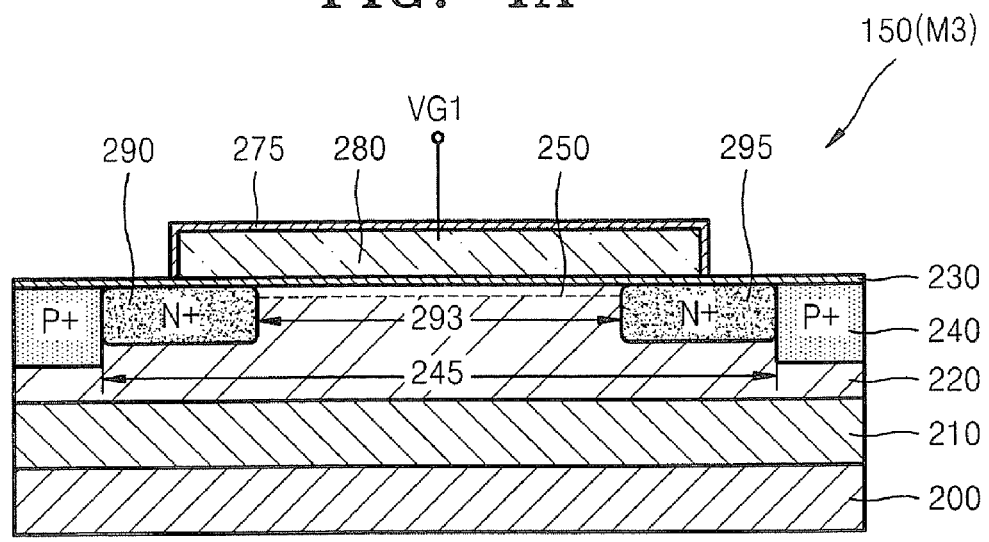
FIG. 4A is a cross-sectional view taken along line IVA-IVA of FIG. 3.
Figure 4B:
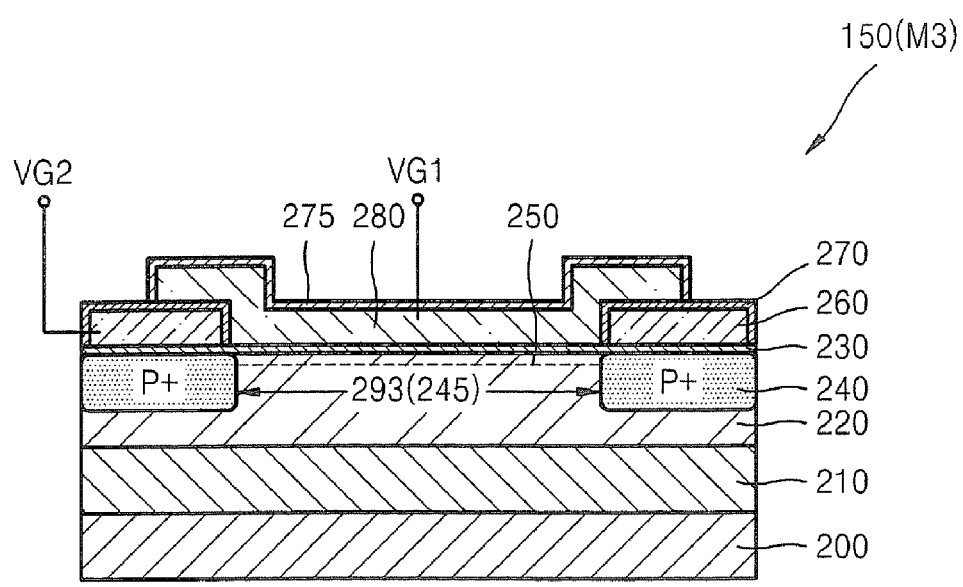
FIG. 4B is a cross-sectional view taken along line IVB-IVB of FIG. 3.

Reference is now made to FIGS. 3, 4A and 4B, which are a plan view of the MOS transistor M3 of the amplification unit 150, shown in FIG. 2, a cross-sectional view taken along line IVA-IVA of FIG. 3 and a cross-sectional view taken along line IVB-IVB of FIG. 3, respectively. An epitaxial layer 210 is formed on a semiconductor substrate 200. The epitaxial layer 210 may have an n-type or p-type conductivity. A P-type well 220 is formed within the epitaxial layer 210. In some embodiments, the P-type well 220 may be formed within the semiconductor substrate 200 without forming the epitaxial layer 210.

A $P^+$-type impurity region 240 may be formed to define an active region 245 within the P-type well 220. In this regard, the $P^+$-type impurity region 240 may be formed to surround the active region 245. An $N^+$-type source region 290 and an $N^+$-type drain region 295 may be formed spaced apart from each other within the active region 245. A channel region 293 may be defined between the source region 290 and the drain region 295. An ion implant layer 250 may be formed in the channel region 293 so as to adjust a threshold voltage of the NMOS transistor M3. A conductivity of the ion-implant layer 250 may be the same as those of the source and drain regions 290 and 295, but may be opposite to that of the P-type well 220.

A gate 280 may be formed over the channel region 293 and configured to extend in a direction crossing the active region 245. An electrode layer 260 may be formed between the gate 280 and the $P^+$-type impurity region 240. The electrode layer 260 may be formed to overlap the $P^+$-type impurity region 240 that contacts the channel region 293 without overlapping the channel region 293. In this regard, the electrode layer 260 may prevent the formation of a parasitic capacitor between the gate 280 and the $P^+$-type impurity region 240. A first gate insulation layer 230 may be formed between the semiconductor substrate 200 and the gate 280. In some embodiments, the first gate insulation layer may further be formed between the semiconductor substrate 200 and the electrode layer 260. A second gate insulation layer 270 may be formed between the gate 280 and the electrode layer 260 and configured to surround the electrode layer 260. A capping layer 275 may be formed on the gate 280.

A gate voltage VG1 for driving the NMOS transistor M3 may be applied to the gate 280, and a bias voltage VG2 having a substantially constant voltage level may be applied to the electrode layer 260. The bias voltage VG2 may be a ground voltage of zero volts or a negative voltage. In some embodiments, the bias voltage VG2 may be in the range from zero volts to −VG1, where −VG1 represents a voltage having a magnitude equal to and a polarity opposite to the gate voltage VG1.

For example, when a positive gate voltage VG1 is applied to the gate 280, a parasitic capacitance may be formed between the $P^+$-type impurity region 240 and the gate 280. In this regard, the gate voltage VG1 applied to the gate 280 may be changed by a coupling effect. Consequently, noise may be generated and the characteristics of the transistor may be degraded. The electrode layer 260 may be disposed between the gate 280 and the $P^+$-type impurity region 240. When the voltage VG2 having a polarity opposite to that of the gate voltage VG1 is applied to the electrode layer 260, the $P^+$-type impurity region 240 may exhibit a much higher P-type conductivity. In this manner, the coupling effect may be blocked and/or reduced and the generation of noise may be prevented.

Reference is now made to FIGS. 5A through 5I, which are cross-sectional views taken along line IVB-IVB of FIG. 3 and illustrate methods of fabricating a MOS transistor according to some embodiments of the present invention. An N-type or P-type epitaxial layer 210 may be formed on a semiconductor substrate 200 using an epitaxial process. A P-type well 220 may be formed by implanting P-type impurity ions 221 into the epitaxial layer 210.

Figure 5A:
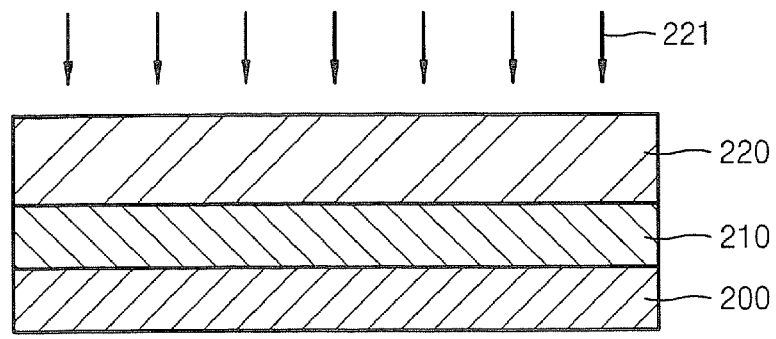
FIGS. 5A through 5I are cross-sectional views illustrating a method of fabricating a MOS transistor according to some embodiments of the present invention.
Figure 5B:
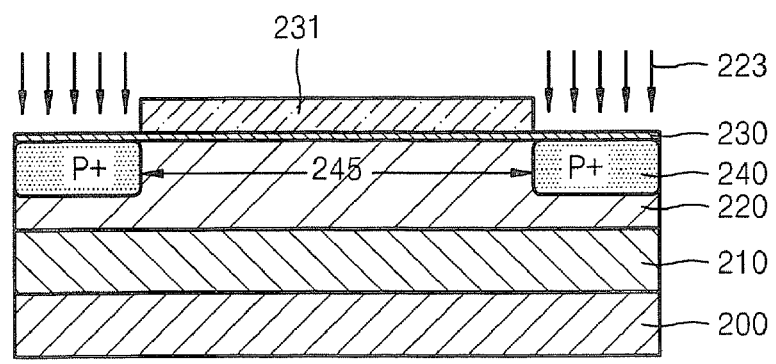

Referring to FIG. 5B, a gate insulation layer 230 may be formed on the semiconductor substrate 200. The gate insulation layer 230 may include an oxide layer formed using an oxidation process. A first photoresist pattern 231 may be formed on a portion of the gate insulation layer 230 corresponding to a region where an active region 245 may be formed. A P$^+$-type impurity region 240 may be formed by implanting P$^+$-type impurity ions 223 into the P-type well 220 using the first photoresist pattern 231 as a mask. The active region 245 may be defined in the P$^+$-type impurity region 240.

Figure 5C:
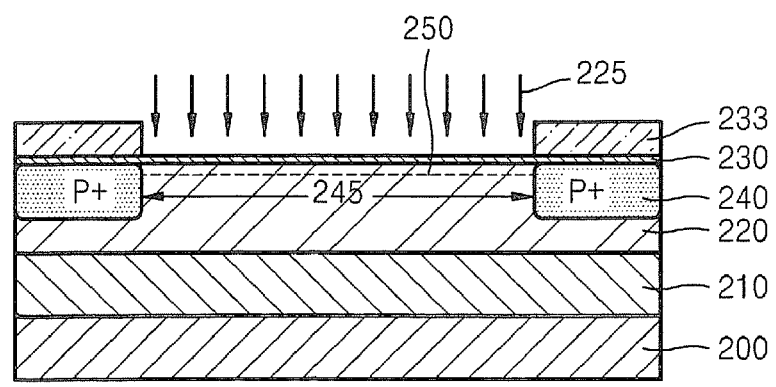

Referring to FIG. 5C, after removing the first photoresist pattern 231, a second photoresist pattern 233 may be formed on the gate insulation layer 230. The second photoresist pattern 233 may be configured to expose the active region 245. An ion implant layer 250 may be formed by implanting impurity ions 225 into the active region 245 using the second photoresist pattern 233 as a mask. The ion implant layer 250 may serve to adjust a threshold voltage of the NMOS transistor. In some embodiments, the ion implant layer 250 has an n-type conductivity.

Figure 5D:
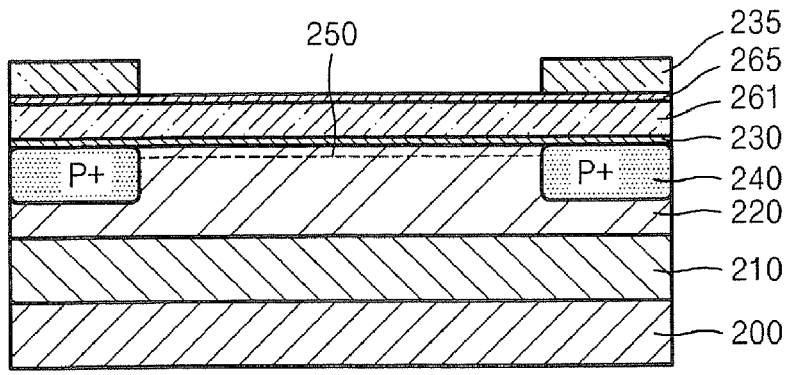
Figure 5E:
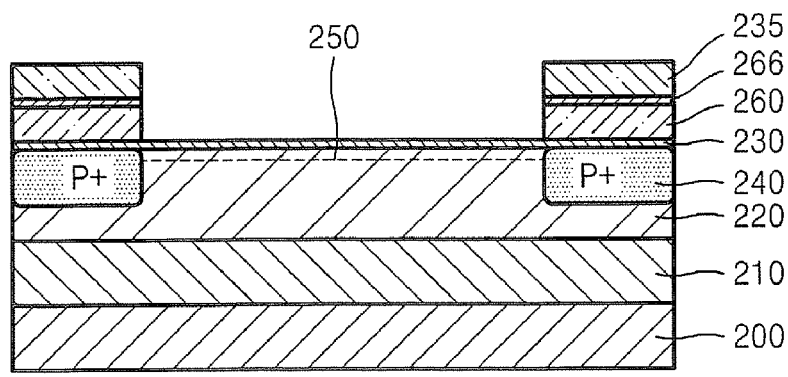

Referring to FIGS. 5D and 5E, after removing the second photoresist pattern 233, a first polysilicon layer 261 and a first insulation layer 265 may be sequentially formed on the first gate insulation layer 230. The first insulation layer 265 may include an oxide layer formed by an oxidation process. A third photoresist pattern 235 may be formed on a portion of the first insulation layer 265 corresponding to the P$^+$-type impurity region 240. Referring to FIG. 5E, using the third photoresist pattern 235 as a mask, the first insulation layer 265 and the first polysilicon layer 261 may be patterned to thus form an electrode layer 260 and a first insulation layer pattern 266 on the electrode layer 260.

Figure 5F:
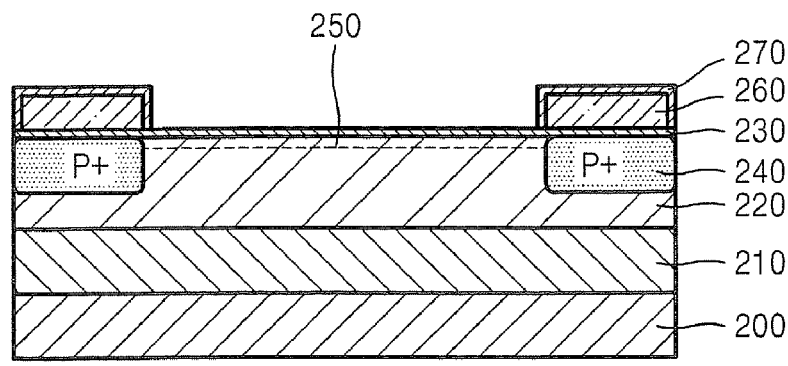

Referring to FIG. 5F, the third photoresist pattern 235 and the first insulation layer pattern 266 may be removed. A second gate insulation layer 270 may be formed on the electrode layer 260. The second gate insulation layer 270 may include an oxide layer formed by an oxidation process.

Figure 5G:
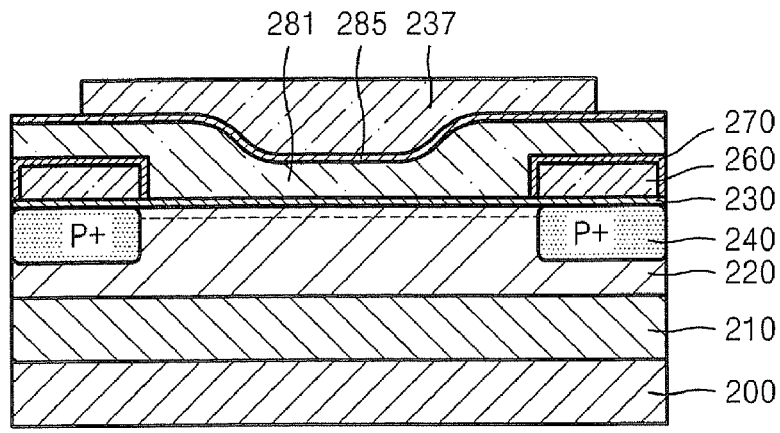
Figure 5H:
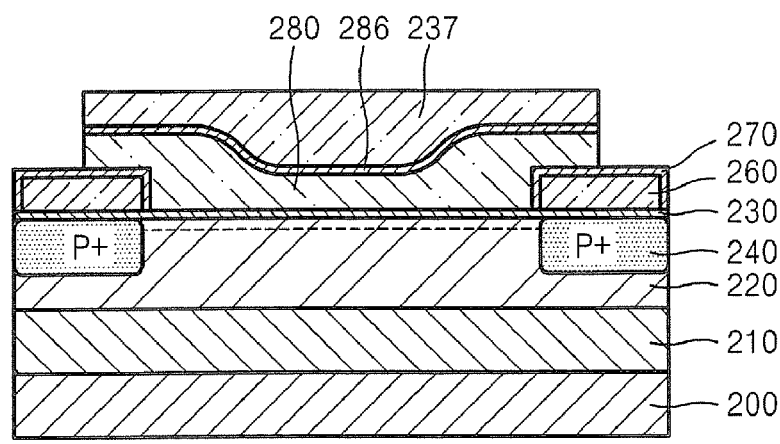

Referring to FIGS. 5G and 5H, a second polysilicon layer 281 may be formed on the first gate insulation layer 230 and the second gate insulation layer 270. Then, a second insulation layer 285 may be formed on the second polysilicon layer 281. The second insulation layer 285 may include an oxide layer formed by an oxidation process. A fourth photoresist pattern 237 may be formed on the second insulation layer 285 corresponding to the channel region 293 and the electrode layer 260. Using the fourth photoresist pattern 237 as a mask, the second insulation layer 285 and the second polysilicon layer 281 may be patterned to form a gate 280 and a second insulation layer pattern 286 may be formed on the gate 280.

Figure 5I:
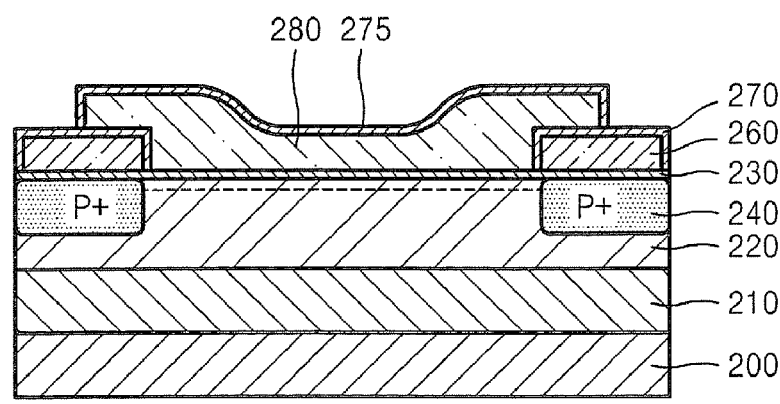

Referring to FIG. 5I, the fourth photoresist pattern 237 and the second insulation layer pattern 286 may be removed. A third insulation layer 275 may be formed as a capping layer on the gate 280. The third insulation layer 275 may include an oxide layer formed by an oxidation process. Then, using the gate 280 as a mask, N$^+$-type impurity ions may be implanted into the active region 245 to form a source region 290 and a drain region 295 on either side of the gate 280. A channel region 293 may be defined between the source region 290 and the drain region 295. The source region 290 and the drain region 295 may be formed prior to the removal of the fourth photoresist pattern 237.

Although not shown, a via hole exposing the gate 280 and the electrode layer 280 may be formed by forming an interlayer insulation layer on the insulation layers 270 and 275 and etching the interlayer insulation layer and the insulation layers 270 and 275. A contact plug may be formed in the via hole, and metal lines may be formed on the interlayer insulation layer such that they are connected to the gate 280 and the electrode layer 260.

As described above, by isolating the active region with the P$^+$-type impurity region, the occurrence of noise due to the breaking of the dangling bonding between the substrate and the oxide layer may be prevented. In addition, the electrode layer may be formed between the P$^+$-type impurity region and the gate and a predetermined bias voltage may be applied to the electrode layer. In this regard, the capacitance coupling between the gate and the P$^+$-type impurity region may be reduced or prevented, which may improve the characteristics of the device.

Although the present invention has been described in terms of specific embodiments, the present invention is not intended to be limited by the embodiments described herein. Thus, the scope may be determined by the following claims.

What is claimed is:

1. A transistor comprising:
   a semiconductor substrate;
   a well of a first conductivity type formed on the semiconductor substrate;
   a heavily-doped first impurity region of the first conductivity type surrounding an active region defined in the well;
   heavily-doped second and third impurity regions of a second conductivity type spaced apart from each other in the active region, the heavily-doped second and third regions configured to define a channel region interposed therebetween;
   a gate formed over the channel region to cross the active region, the gate configured to overlap at least a portion of the first impurity region and receive a first voltage;
   an electrode layer formed between the semiconductor substrate and the gate, the electrode layer configured to overlap a portion of the first impurity region contacting the channel region and receive a second voltage; and
   an insulation layer formed between the semiconductor substrate and the electrode layer, the semiconductor substrate and the gate, and the electrode layer and the gate, the insulation layer configured to surround the electrode layer.

2. The transistor of claim 1, wherein the second voltage comprises a constant magnitude.

3. The transistor of claim 2, wherein the second voltage comprises zero volts.

4. The transistor of claim 2, wherein the second voltage comprises a voltage in the ranges from zero volts to a voltage having a magnitude equal to that of the first voltage and a polarity opposite to that of the first voltage.

5. The transistor of claim 1, wherein the insulation layer comprises an oxide layer formed by an oxidation process.

6. The transistor of claim 1, further comprising an epitaxial layer formed on the substrate, wherein the well is formed within the epitaxial layer.

7. The transistor of claim 1, further comprising an ion implant layer formed in the channel region configured to adjust a threshold voltage of the transistor.

8. The transistor of claim 1, further comprising a capping layer formed on the gate to surround the gate.

9. The transistor of claim 8, wherein the capping layer comprises an oxide layer formed by an oxidation process.

10. An image sensor comprising:
    a photoelectric conversion unit that is configured to convert incident light into an electric signal;
    a charge transfer unit that is configured to transfer charges accumulated in the photoelectric conversion unit;

a charge detection unit that is configured to convert the accumulated charges transferred through the charge transfer unit into a voltage signal;

an amplification unit that is configured to amplify the voltage signal from the charge detection unit; and a reset unit that is configured to reset the charge detection unit, wherein the amplification unit comprises a metal-oxide-semiconductor (MOS) transistor, the MOS transistor comprising:

a semiconductor substrate;

a well of a first conductivity type formed on the semiconductor substrate;

a heavily-doped first impurity region of the first conductivity type configured to surround an active region defined in the well;

heavily-doped second and third impurity regions of a second conductivity type spaced apart from each other in the active region, the heavily-doped second and third regions configured to define a channel region interposed therebetween;

a gate formed over the channel region to cross the active region, the gate configured to overlaps at least a portion of the first impurity region and receives a first voltage;

an electrode layer formed between the semiconductor substrate and the gate, the electrode layer configured to overlaps a portion of the first impurity region contacting the channel region and receives a second voltage; and an insulation layer formed between the semiconductor substrate and the electrode layer, the semiconductor substrate and the gate, and the electrode layer and the gate, the insulation layer configured to surrounds the electrode layer.

11. The image sensor of claim 10, wherein the second voltage comprise a constant magnitude.

12. The image sensor of claim 11, wherein the second voltage comprises zero volts.

13. The image sensor of claim 11, wherein the second voltage comprises a voltage in a ranges from zero volts to a voltage having a magnitude equal to that of the first voltage and a polarity opposite to that of the first voltage.

* * * * *